United States Patent
Colburn et al.

(10) Patent No.: US 8,491,987 B2
(45) Date of Patent: Jul. 23, 2013

(54) SELECTIVELY COATED SELF-ALIGNED MASK

(75) Inventors: Matthew E Colburn, Hopewell Junction, NY (US); Stephen M Gates, Ossining, NY (US); Jeffrey C Hedrick, Montvale, NJ (US); Elbert Huang, Tarrytown, NY (US); Satyanarayana V Nitta, Poughquag, NY (US); Sampath Purushothaman, Yorktown Heights, NY (US); Muthumanickam Sankarapandian, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 827 days.

(21) Appl. No.: 12/164,647

(22) Filed: Jun. 30, 2008

(65) Prior Publication Data

US 2008/0265382 A1 Oct. 30, 2008

Related U.S. Application Data

(62) Division of application No. 11/143,793, filed on Jun. 2, 2005, now abandoned, which is a division of application No. 10/287,905, filed on Nov. 5, 2002, now Pat. No. 6,911,400.

(51) Int. Cl.
*H01L 23/58* (2006.01)
*C08L 53/00* (2006.01)

(52) U.S. Cl.
USPC .................................................. 428/195.1

(58) Field of Classification Search
USPC .................................................. 428/195.1
See application file for complete search history.

(56) References Cited

U.S. PATENT DOCUMENTS

| | | | |
|---|---|---|---|
| 4,699,950 A * | 10/1987 | Sato et al. | 525/185 |
| 5,171,777 A | 12/1992 | Kuphal et al. | |
| 5,284,916 A | 2/1994 | Drzewinski | |
| 5,919,835 A | 7/1999 | Domb et al. | |
| 6,043,322 A | 3/2000 | Scott et al. | |

(Continued)

OTHER PUBLICATIONS

O. PUcker and J. Ruhe, "Polymer Layers Through Self-Assembled Monolayers of Initiatiors," vol. 14, No. 24, pp. 6893-6898, Am. Chem. Society, Oct. 30, 1998.

(Continued)

*Primary Examiner* — Gerard Higgins
*Assistant Examiner* — Sathavaram I Reddy
(74) *Attorney, Agent, or Firm* — Ohlandt, Greeley, Ruggiero & Perle, LLP.; Daniel P. Morris (57) ABSTRACT

A method for forming a self aligned pattern on an existing pattern on a substrate comprising applying a coating of a solution containing a masking material in a carrier, the masking material having an affinity for portions of the existing pattern; and allowing at least a portion of the masking material to preferentially assemble to the portions of the existing pattern. The pattern may be comprised of a first set of regions of the substrate having a first atomic composition and a second set of regions of the substrate having a second atomic composition different from the first composition. The first set of regions may include one or more metal elements and the second set of regions may include a dielectric. The first and second regions may be treated to have different surface properties. Structures made in accordance with the method. Compositions useful for practicing the method.

6 Claims, 7 Drawing Sheets

U.S. PATENT DOCUMENTS

| | | | |
|---|---|---|---|
| 6,261,730 | B1 | 7/2001 | Yanus et al. |
| 6,433,931 | B1 * | 8/2002 | Fink et al. .................... 359/586 |
| 6,565,763 | B1 * | 5/2003 | Asakawa et al. ................ 216/56 |
| 6,641,899 | B1 | 11/2003 | Colburn et al. |
| 6,787,277 | B2 | 9/2004 | Tong et al. |
| 6,977,108 | B2 | 12/2005 | Hieda et al. |

OTHER PUBLICATIONS

Noo Li Jeon, Insung S. Choi and George M. Whitesides, "Patterned Polymer Growth on Silicon Surfaces Using Mircrocontact Printing and Surface-Initiated Polymerization," vol. 75, No. 26, pp. 4201-4203, Am. Institute of Physics, Dec. 27, 1999.

Jiang et al., "Selective Deposition in Layer-by-Layer Assembly: Functional Graft Copolymers as Molecular Templates," Am. Chem. Society, vol. 16, pp. 8501-8509, Sep. 29, 2000.

Boltau et al., "Surface-induced Structure Formation of Polymer Blends on Patterned Substrates," Letter to Nature, vol. 391, pp. 877-879, Feb. 26, 1998.

Lens et al., "Morphological Transitions of Wetting Layers on Structured Surfaces," The American Physical Society, vol. 80, No. 9, pp. 1920-1923, Mar. 2, 1998.

Kielhorn et al., "Phase Separation of Polymer Blend Films Near Patterned Surfaces," Journal of Chemical Physics, vol. 111, Dec. 22, 1989.

Heier et al., Transfer of Chemical Substrate Pattern into an Island-Forming Diblock Copolymer Film, Journal of Chemical Physics, vol. 111, Dec. 22, 1999.

\* cited by examiner

Fig. 1: General Process Flow for Self Aligned Mask Generation by Self-Assembly

Fig. 2: First, Second, Third Methods for Self Aligned Mask Generation by Polymer Mixtures Fig. 3: Fourth Method for Self Aligned Mask Generation by Block Copolymer Terracing Fig. 4: Fifth Method for Self Aligned Mask Generation by Selective Dewetting Fig. 5: Sixth Method for Self Aligned Mask Generation by Preferential Adsorption Fig. 6: Cross Sectional View of Semiconductor Device Fig. 7: Cross Sectional View of Semiconductor Device

SELECTIVELY COATED SELF-ALIGNED MASK

CROSS REFERENCE TO RELATED APPLICATION

The present application is a divisional of U.S. Ser. No. 11/143,793, filed Jun. 2, 2005 now abandoned, which is a divisional of U.S. Ser. No. 10/287,905, filed Nov. 5, 2002, which issued as U.S. Pat. No. 6,911,140, both of which are incorporated herein by reference.

FIELD OF THE INVENTION

This invention relates to the production of patterns on a substrate having regions with different compositions or different surface treatment. More particularly, it relates to a method of producing fine patterns on substrates used in, for example, the microelectronics industry on which electronic devices are fabricated. It is also related to devices fabricated in accordance with the methods. The patterns are fabricated accurately and inexpensively without the use of lithography. The present invention also provides many additional advantages, which shall become apparent as described below.

BACKGROUND OF THE INVENTION

A number of applications and technologies involve structures having a well-defined arrangement of chemically distinct components. Normally, these structures are defined by patterning processes such as lithography, embossing, and stamping, and have length scales ranging from 10 nanometers to several microns. In many of these systems it may be necessary or highly beneficial to apply an additional component or treatment to only one of the components at the surface. One commonly used technique for doing this is through the use of a mask to protect regions where this additional application or treatment is not desired. Effectively, the mask material directs this treatment to the intended surfaces, which are fully exposed. Unfortunately, typical procedures used to generate a mask by lithographic or other means can be expensive and error prone. Thus, techniques for circumventing these conventional approaches would be highly advantageous.

A particular example in which such strategies would be useful involves integrated circuits comprised of metal and dielectric components. It is widely known that the speed of propagation of interconnect signals is one of the most important factors controlling overall circuit speed as feature sizes are reduced and the number of devices per unit area is increased. Throughout the semiconductor industry, there has been a strong drive to reduce the dielectric constant, k, of the dielectric materials existing between metal lines and/or to minimize the thickness of layers have comparatively larger dielectric constants, e.g., cap barrier layer. Both of these approaches reduce the effective dielectric constant, $k_{eff}$, of the components between metal lines and as a result, interconnect signals travel faster through conductors due to a reduction in resistance-capacitance (RC) delays. Unfortunately, these strategies are difficult to implement due to limitations in maintaining sufficient properties, i.e., mechanical, barrier, electrical, etc., that result with a reduction in thickness or a change in the chemistry of the layers.

SUMMARY OF THE INVENTION

This invention relates to a method to fabricate mask layers onto a pre-patterned substrate having two or more chemically distinct surface regions, or two or more surface regions that have undergone different surface treatment. The mask layer is deposited by a self-assembly approach that provides self-alignment of the layers. This method can apply to any technology or application involving a chemically or physically heterogeneous substrate including: interconnect structures for high speed microprocessors, application specific integrated circuits (ASICs), flexible organic semiconductor chips, and memory storage. Other structures that can be fabricated utilizing this method include: displays, circuit boards, chip carriers, microelectromechanical systems (MEMS), chips for hi-throughput screening, microfabricated fluidic devices, etc. The utility of this method stems from a simple and robust means in which the replication of a patterned substrate to generate a mask layer can be performed, circumventing the requirement for difficult and error prone methods, such as lithography. Thus, the present invention provides an extremely advantageous alternative to the prior art techniques.

In the example of integrated circuits, the effective dielectric constant is reduced by the use of a process where layers are selectively placed upon the metal lines. To do this, mask layers are first applied to the dielectric or hard mask surfaces. These layers are generated by self-assembly mechanisms described below. By using these processes the layers can be self-aligned such that lithographic processes are not required to define the features. Upon self-alignment on the dielectric/hard-mask surfaces, these layers, can then be used as a mask for subsequent deposition of other layers which serve as: diffusion barriers to copper, oxygen and/or water, layers which reduce the electromigration attributes of the metal lines, and seed layers.

Thus, in the example of integrated circuits, the use of the self-aligned masks allows a simplified fabrication process in which the effective dielectric constant between metal lines can be reduced through selective application of various materials to the metal lines. This is of great importance in maximizing the propagation speed of interconnect signals and ultimately provides faster overall circuit performance. Furthermore, the present invention leads to a higher level of protection and reliability of interconnect structures and to reduced processing costs.

Another application of this invention is its use for semiconductor packaging substrates which are comprised of conductors (usually copper) and insulators (usually epoxy, polyimide, alumina, cordierite glass ceramic and the like) disposed adjacent to each other. The conductors can be protected from external ambients, and process exposures such as soldering and wet etching. This protection can be achieved by using the various methods of forming selective coatings on the conductor. Alternately, selective coating on the dielectric by one of the exemplary methods can leave the metal exposed for further processing by methods such as electroless plating to add additional metal layers such as nickel, cobalt, palladium, gold and others, on top, without exposing the dielectrics to these process steps. The ability to accomplish these selective modifications without the use of lithographic processing leads to cost reductions and is particularly advantageous in microelectronic packaging which is very cost sensitive.

Although, the utilization of the self-aligned masks are described for microelectronic parts, this method is envisioned to be useful for any application whereby the modification of a specific component in a pre-patterned substrate is beneficial.

Thus, the invention is directed to a method for forming a self aligned pattern on an existing pattern on a substrate comprising applying a coating of a solution containing a masking material in a carrier (or solvent), the masking material having an affinity for portions of the existing pattern; and allowing at least a portion of the masking material to preferentially assemble to the portions of the existing substrate pattern. The masking material may be an amorphous polymeric system having any chain architecture (including linear, networked, branched, dendrimeric) and can contain one or more monomeric units). In general, the masking material may be selected from the group consisting of: poly(vinyl pyridines), poly(vinyl pyrrolidones), poly(vinyl imidazoles) poly(stryenes), poly(esters), poly(methacrylates), poly(acrylates) and poly(glycols), polycarbonates, polyvinylacetates polyalkyls, polyamides, polynitriles, polyureas, polyurethanes, polyethers, polysulfones, polythioethers, polyoxazoles, polyimides, polyheterocyclics, polysilicones, and polysilanes. In general, these materials have an affinity for dielectrics. The patterned substrate may be comprised of a first set of regions of the substrate having a first atomic composition and a second set of regions of the substrate having a second atomic composition different from the first composition. The first set of regions may include one or more metal elements and the second set of regions may include a dielectric.

The masking material may include a first polymer and a second polymer, the first polymer having an affinity for the first set of regions and the second polymer having an affinity for the second set of regions, so that the first polymer coats the first regions and the second polymer coats the second regions. The method may further comprise a step of selectively removing the first polymer, leaving behind the second polymer on the second set of regions which can serve as the patterning layer. This may be accomplished by rinsing, ultrasonication, dissolution, thermolysis, chemical reaction, irradiation, and/or decomposition. The first set of regions may include one or more metal elements and the second set of regions may include a dielectric.

The first polymer is selected from the group consisting of: poly(vinyl pyridines), poly(vinyl pyrrolidones), poly(vinyl imidazoles) poly(styrenes) and poly(esters), polyphosphazenes, polythiophenes, polyimines, polyheterocyclics: polyimides, polyoxazoles, polybenzoxazoles, polythiazoles, polypyrazoles, polytriazoles, and polythiophenes. In general, these materials have an affinity for metals. The second polymer may be selected from the group consisting of: poly(vinyl pyridines), poly(vinyl pyrrolidones), poly(vinyl imidazoles) poly(stryenes), poly(esters), poly(methacrylates), poly(acrylates) and poly(glycols), polycarbonates, polyvinylacetates polyalkyls, polyamides, polynitriles, polyureas, polyurethanes, polyethers, polysulfones, polythioethers, polyoxazoles, polyimides, polyheterocyclics, polysilicones, and polysilanes. As noted above, in general, these materials have an affinity for dielectrics.

The masking material may include a first polymer and a second polymer which are miscible. One of the polymers may be preferentially assembled to portions of the pattern due to a surface induced phase separation.

The masking material may be comprised of a block copolymer in which blocks are covalently linked. When the pattern is comprised of a first set of regions of the substrate having a first atomic composition and a second set of regions of the substrate having a second atomic composition different from the first composition, a first polymer of the block is attracted to the first regions and a second polymer of the block is attracted to the second regions. For the specific case of a block copolymer, a terraced topography may be formed which corresponds to the first regions and the second regions, the coating being thicker above the second regions. The method may further comprise removing a thickness of the masking material sufficient to expose the first regions. The removing may be accomplished using a dry etch process. A first copolymer of the block may be selected from the group consisting of poly(vinyl pyridines), poly(vinyl pyrrolidones), poly(vinyl imidazoles) and poly(stryenes). A second copolymer may be selected from the group consisting of poly(styrenes), poly (methacrylates), poly(acrylates) and poly(glycols).

When the pattern is comprised of a first set of regions of the substrate having a first atomic composition and a second set of regions of the substrate having a second atomic composition different from the first composition, the masking material may have properties such that it dewets from the regions of first atomic composition and wets the regions of second atomic composition. The first regions may include a metal and the second regions may include a dielectric.

The masking material may be functionalized with a group that forms a strong physical attraction to substrate surface regions having the second atomic composition. The functionalized groups may be selected from hydroxys, esters, ethers, aldehydes, ketones, carbonates, acids, phenols, amines, amides, imides, thioesters, thioethers, ureas, urethanes, nitrites, isocyanates, thiols, sulfones, halides, phosphines, phosphine oxides, phosphonimides, nitros, and azos.

The masking material is applied to the substrate by any method known in the art, including but not limited to: spin-coating, dip coating, spray coating, scan coating and using a doctor blade.

Regions of the substrate may be comprised of copper and may be patterned electrical interconnects. The substrate may be a silicon wafer containing microelectronic devices, a ceramic chip carrier, an organic chip carrier, a glass substrate, a gallium arsenide, silicon carbide or other semiconductor wafer, a circuit board, or a plastic substrate The method may further comprise chemically treating regions of the substrate prior to applying the coating. The chemically treating may be comprised of at least one of plasma treatment, application of an oxidizing or reducing solution, annealing in an oxidizing or reducing atmosphere and application of a material that renders surface portions of the substrate, to which it is applied, hydrophobic or hydrophilic. The chemical treatment may change the wetting characteristics of the regions of the substrate. The chemically treating may comprise applying a surface modifying substance such as one of $Si_xL_yR_z$, where L is selected from the group consisting of hydroxy, methoxy, ethoxy, acetoxy, alkoxy, carboxy, amines, halogens, R is selected from the group consisting of hydrido, methyl, ethyl, vinyl, phenyl (any alkyl or aryl). These materials may include: hexamethyldisilazane, vinyltriacetoxysilane, aminopropyltrimethoxysilane, trimethychlorosilane, trimethylacetoxysilane, and other various silane coupling agents. The chemically treating may comprise applying a surface modifying substance having various functionalities that can involve acid/base interactions or hydrogen bonding.

The method may further comprise a step of chemically treating regions of the substrate prior to the coating with materials that have an affinity to metals. These materials include molecules having functional groups comprising hydroxys, esters, ethers, aldehydes, ketones, carbonates, acids, phenols, amines, amides, imides, thioesters, thioethers, ureas, urethanes, nitriles, isocyanates, thiols, sulfones, halides, phosphines, phosphine oxides, phosphonimides, nitros, azos, thioesters, and thioethers. They can be heterocyclics, including benzotriazoles, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, and indolines.

The method may further comprise a step of annealing the substrate after applying the coating.

The invention is also directed to a structure comprising a self aligned pattern on an existing pattern on a substrate, the self aligned pattern including a masking material having an affinity for portions of the existing pattern, so that the masking material preferentially assembled to the portions of the existing pattern. The pattern may be comprised of a first set of regions of the substrate having a first atomic composition and a second set of regions of the substrate having a second atomic composition different from the first composition. The first set of regions may include one or more metal elements and the second set of regions may include a dielectric. The self-aligned pattern may be disposed upon the second set of regions, or only upon the second set of regions. The self-aligned pattern is generally not disposed upon the first set of regions.

The structure may be comprised of at least one conductive feature, formed on the substrate, with the substrate further comprising at least one insulating layer surrounding the conductive feature. The insulating layer may surround the at least one conductive feature at its bottom and lateral surfaces. The structure may further comprise at least one conductive barrier layer disposed at, at least one interface between the insulating layer and the at least one conductive feature. The combination of the at least one conductive feature and the insulating layers, may be repeated to form a multilevel interconnect stack.

The structure may be one of a silicon wafer containing microelectronic devices, a ceramic chip carrier, an organic chip carrier, a glass substrate, a gallium arsenide, silicon carbide or other semiconductor wafer, a circuit board, or a plastic substrate.

Other and further objects, advantages and features of the present invention will be understood by reference to the following specification in conjunction with the annexed drawings, wherein like parts have been given like numbers.

DESCRIPTION OF THE PREFERRED EMBODIMENTS

In accordance with the invention, a patterned substrate containing structures having two or more distinct components is processed by a route whereby layers can be applied to selected component surfaces. This layer can be generated by a number of self-assembly approaches described below and can be used as a mask layer for subsequent treatment or material deposition onto the intended component surfaces. These structures can be sacrificial and, in general, do not remain in the final structure. The use of the masks for the generation of self assembled barrier layers can proceed by a number of routes including: blanket deposition followed by lift-off, blanket deposition followed by chemical mechanical polishing (CMP), and enhancement of selective electrochemical and electroless metal deposition processes. It will be clear to one skilled in the art that the application of a self-aligned layer by any of the approaches described below can be used as a process to generate a selective mask.

Figure 1:
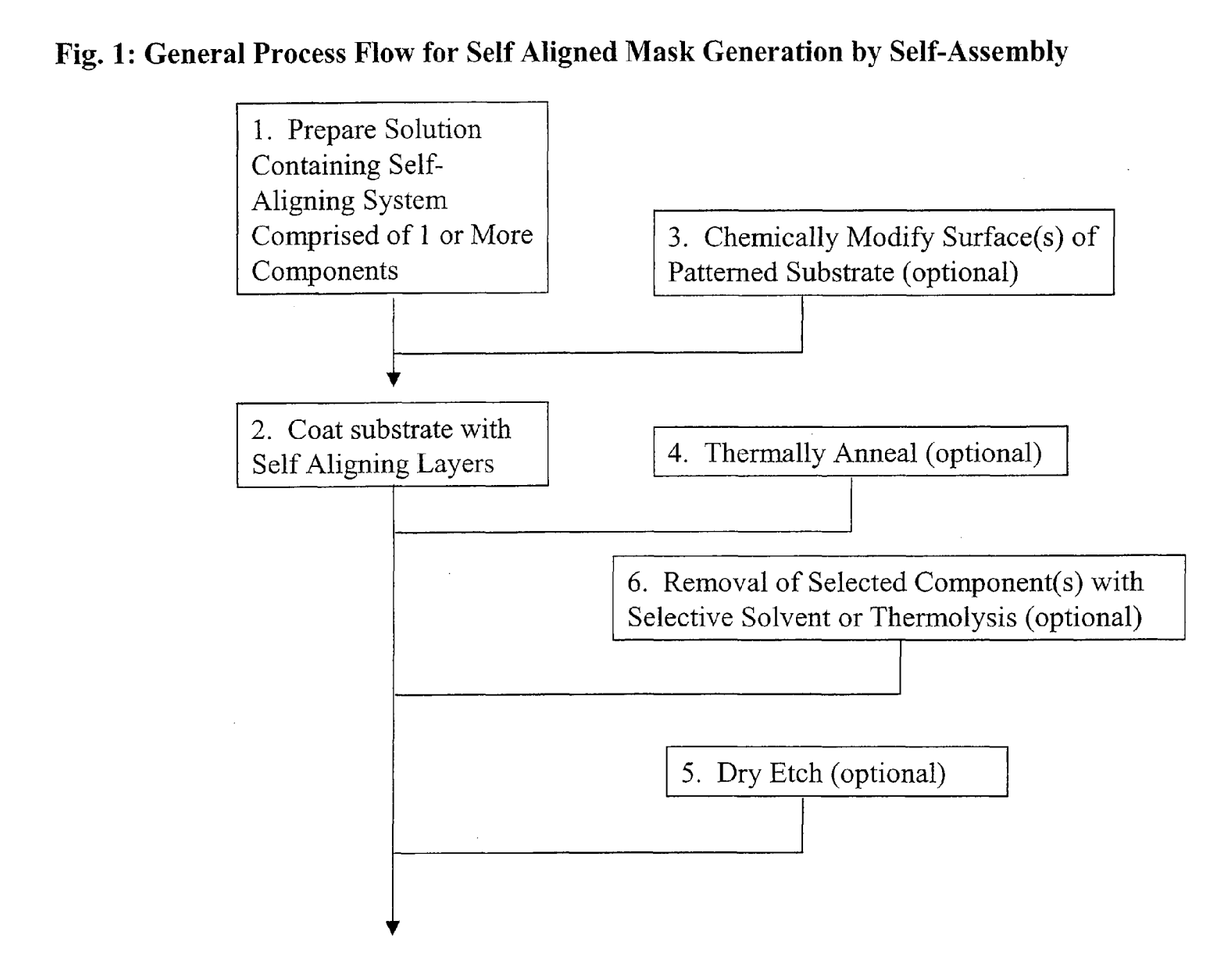
FIG. 1 is a general flow chart for the process of generating a self aligned mask in accordance with the invention.

The general approach is simple and is schematically demonstrated in FIG. 1. First, at step 1, a solution containing the self-aligning system having one or more components is generated. Next, at step 2, a coating is generated from this solution. The coating process in which the each of the methods described below can be performed by any number of means including: spin coating, dip coating, scan coating, spray coating, using a doctor blade, etc. Optionally, the surface characteristics of one or more of the exposed surfaces can be chemically modified, at 3, prior to application of the self aligning mask layer to facilitate each of the methods described below. Furthermore, thermal annealing 4 and dry etch steps 5 may be included to define the final self aligned mask layer. At step 6, selected components may be removed from the substrate by various techniques including rinsing, ultrasonication, dissolution, thermolysis, chemical reaction, irradiation, and decomposition.

The optional chemical modification steps application of the self-aligned mask layer, described above in step 3 of FIG. 1, can be performed with any combination of modification schemes including: plasma treatment, application of an oxidizing or reducing solution, annealing in a reducing or oxidizing atmosphere, and application of a material that renders surface portions of the substrate, to which it is applied, to be hydrophobic or hydrophilic. Specific chemical treatments directed to the dielectric surface 10 may include applying an organosilane comprised of $Si_xL_yR_z$, where L is selected from the group consisting of hydroxy, methoxy, ethoxy, acetoxy, alkoxy, carboxy, amines, halogens, R is selected from the group consisting of hydrido, methyl, ethyl, vinyl, and phenyl (any alkyl or aryl). Specific chemical treatments directed to the metal surface 20 may include applying molecules that have preferential interactions with the metal surface including molecules having the following functional groups: hydroxys, esters, ethers, aldehydes, ketones, carbonates, acids, phenols, amines, amides, imides, thioesters, thioethers, ureas, urethanes, nitriles, isocyanates, thiols, sulfones, halides, phosphines, phosphine oxides, phosphonimides, nitros, azos, thioesters, thioethers, benzotriazole, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, indolines, nitrogenous compounds, and phosphoric acids.

Figures 2, 2A:
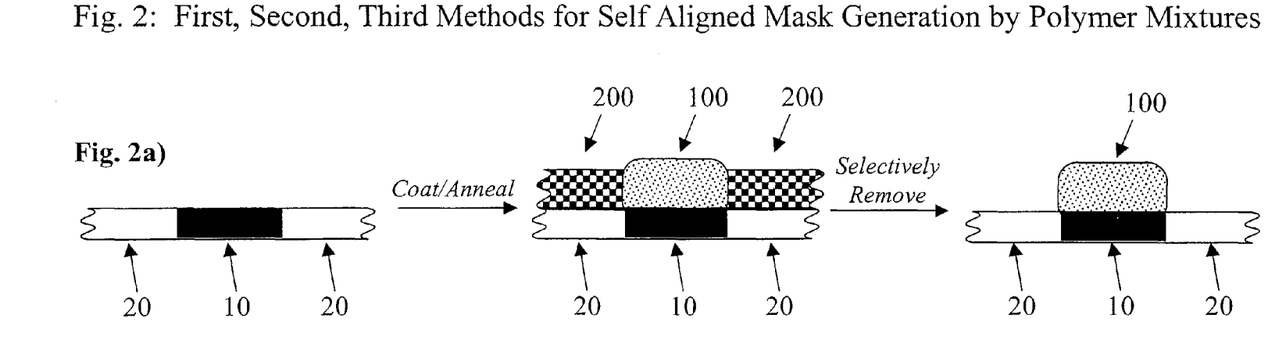
FIGS. 2a, 2b and 2c illustrate first, second and third methods for generating self aligned masks in accordance with the invention, using a mixture of polymers.
Figure 2B:
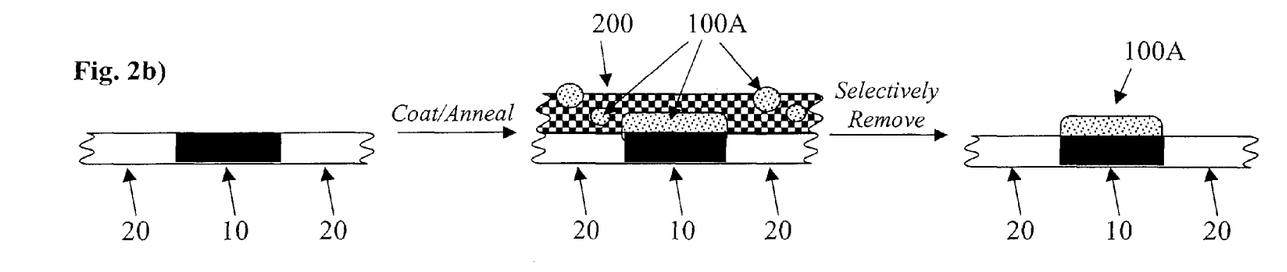
Figure 2C:
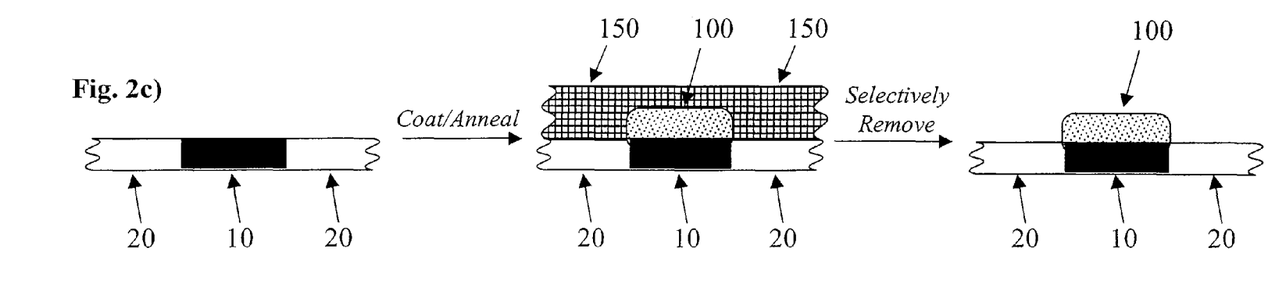

Referring to FIGS. 2a, 2b and 2c, the preferred embodiment of the patterned substrate is an interconnect structure having metal surfaces or regions 20 and dielectric surfaces or regions 10.

Referring to FIG. 2a, a first method, in accordance with the invention, for pattern self-replication uses patterned matched phase separation of a binary material system. An optional chemical modification of either the dielectric surface 10 or metal surface 20, as described previously, can be first performed. A binary system, having polymeric components A and B, is applied uniformly to the patterned substrate from solvent, e.g., by spin or dip coating. Phase separation into discrete A and B rich domains (200 and 100, respectively), can occur either during casting or with thermal annealing. Selective alignment of the domains or the morphology occurs, as the A rich domains 200 segregate to metal surfaces 20 and B rich domains 100 segregate to the dielectric surfaces 10. Selective removal of the A rich domains 200 leads to a structure having the metal surfaces 20 and B rich domains 100 on the dielectric surfaces 10. This structure can then be used as a mask layer for selective deposition by the aforementioned processes to the metal surfaces 20.

For the first method, polymer A can be selected such that there is a high affinity to the metal surfaces 20 and no or unfavorable interfacial interactions exist at the dielectric surface 10. Polymer A may be an amorphous polymeric system having any chain architecture (including linear, branched, dendrimeric) and can contain one or more monomeric units. They can be comprised of, but not limited, to the following systems: poly(vinyl pyridines), poly(vinyl pyrrolidones), poly(vinyl imidazoles), poly(styrenes), poly(esters), polyphosphazenes, polythiophenes, polyimines, polyheterocyclics: polyimides, polyoxazoles, polybenzoxazoles, polythiazoles, polypyazole, polytriazole and polythiophenes. Polymer B also may be amorphous and can be selected having the opposite attributes: high affinity to dielectric surfaces 10 and no or unfavorable interfacial interactions with metal surface 20, and can be comprised of but not limited to the following systems: poly(vinyl pyridines), poly(vinyl pyrrolidones), poly(vinyl imidazoles) poly(stryenes), poly(esters), poly(methacrylates), poly(acrylates) and poly(glycols), polycarbonates, polyvinylacetates polyalkyls, polyamides, polynitriles, polyureas, polyurethanes, polyethers, polysulfones, polythioethers, polyoxazoles, polyimides, polyheterocyclics, polysilicones and polysilanes. However, polymer A and Polymer B must be compositionally different.

Referring to FIG. 2b, it should be noted that this approach is not limited to systems where only A and B rich domains (200 and 100) are located above the metal and dielectric surfaces (20 and 10) throughout the entire coating thickness. A second method, in accordance with the invention, for pattern self-replications allows for coatings with greater morphological complexity, such as but not limited to bilayers, multilayers, and dispersed structures. Such more complex coatings may still be utilized as self aligned mask layers if selective alignment at the patterned substrate interface occurs. An example of such an approach is demonstrated in FIG. 2b wherein a bilayer structure is located atop the dielectric surfaces 10 and a morphology comprised of B rich domains 100A is dispersed in a continuous matrix comprised of the A rich domains 200. Selective removal of the material 200 containing the B rich domains 100A leads to a self-aligned mask.

The preferred materials for the second method are essentially the same as those of the first method.

Referring to FIG. 2c, a third method, in accordance with the invention, for pattern self-replication uses A-B systems that normally do not phase separate. In such a case, the selective accumulation of A or B onto the intended surfaces will be based on a surface induced phase separation mechanism. For example, the A-B system can be selected such that A and B form a miscible A-B phase 150. However, the presence of the dielectric surface 10 induces an enrichment of a B rich domain at the dielectric surface 10. Selective removal of the miscible A-B phase 150 can then be performed, leaving a structure that can be utilized as a self-aligned mask.

The preferred materials for the third method are essentially the same as those of the first method.

Figure 3:
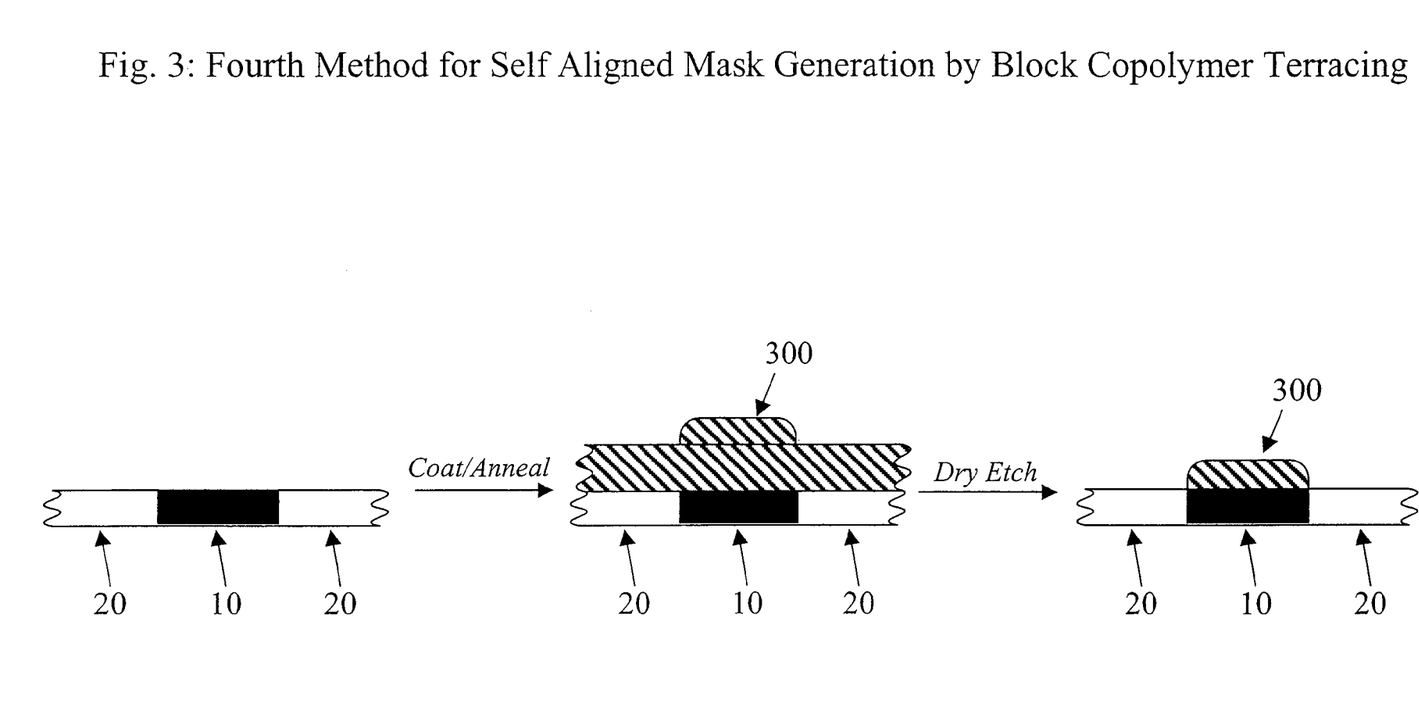
FIG. 3 illustrates a fourth method for generating a self aligned mask in accordance with the invention, by block copolymer terracing.

Referring to FIG. 3, a fourth method, in accordance with the invention, uses block copolymer terrace formation to replicate a preexisting pattern. An optional chemical modification of either the dielectric surface 10 or metal surface 20, as described previously, can be first performed. A block copolymer comprised of A and B blocks is applied uniformly to the substrate surface. The two blocks have varying affinities to the two surfaces, resulting in a segregation of the A block to the metal surface 20 and the B block to the dielectric surface 10. Ordering and alignment by the block copolymer domains produces a coating having a topography that is a replication of the underlying surface chemical heterogeneity 300. The film thickness is selected such that upon ordering, thicker regions of the film are generated on the dielectric surface 10. A controlled etch can then be applied to expose the metal surfaces leaving some of the A-B material located upon the dielectric surface. The resultant film structure can then be used as a mask for deposition of barrier layers onto the metal surfaces 20.

For this fourth method, the block copolymer comprises amorphous polymeric blocks that microphase separate into discrete morphologies (lamellae, cylinders, spheres, etc.). The A block can be selected such that there is a high affinity to the metal surfaces 20 and no or unfavorable interfacial interactions exist at the dielectric surface 10 and can be comprised of but not limited to the following systems: poly(vinyl pyridines), poly(vinyl pyrrolidones), poly(vinyl imidazoles) poly(stryenes). The B block can be selected having the opposite attributes, high affinity to dielectric surfaces 10 and no or unfavorable interfacial interactions with metal surface 20, and can be comprised of but not limited to the following systems: poly(styrenes), poly(methacrylates), poly(acrylates) and poly(glycols), etc.

Figure 4:
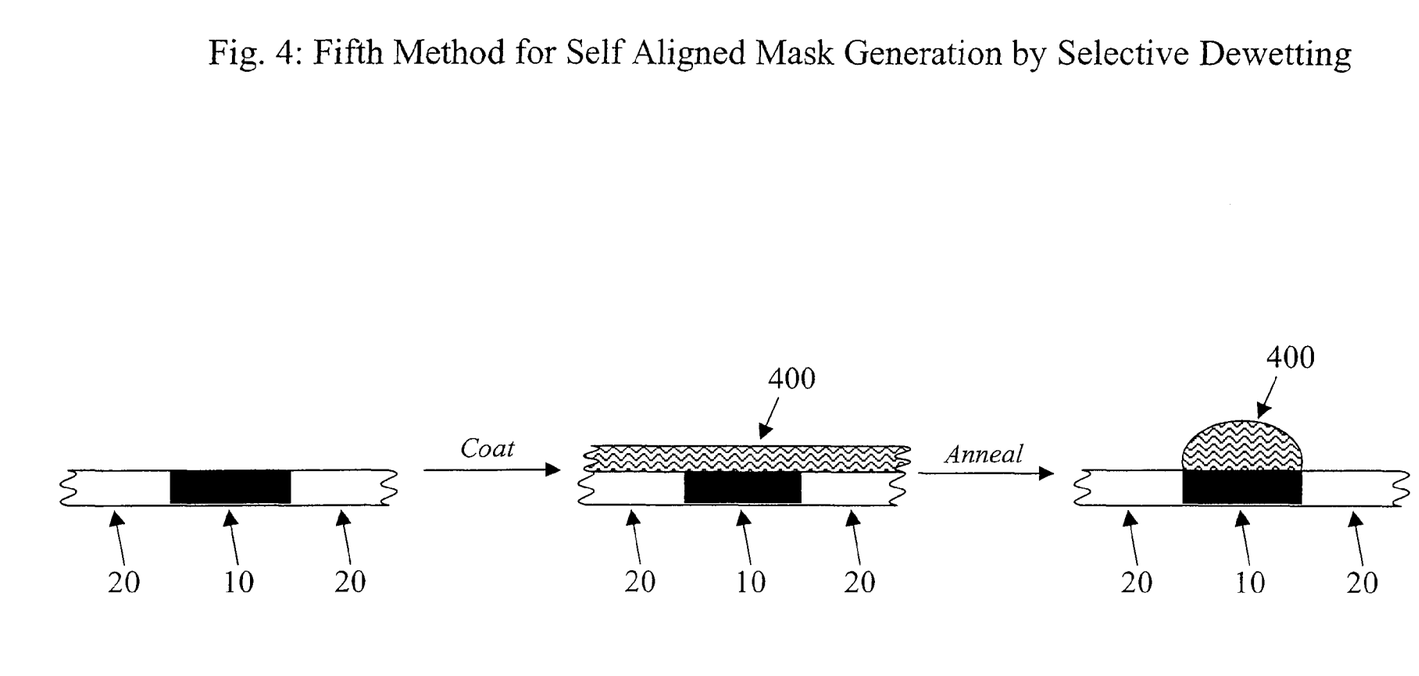
FIG. 4 illustrates a fifth method for generating a self aligned mask in accordance with the invention, by selective wetting.

Referring to FIG. 4, a fifth method, in accordance with the invention, uses a selective dewetting process to replicate a preexisting pattern. An optional chemical modification of either the dielectric surface 10 or metal surface 20, as described previously, can be first performed. The masking material 400 is then applied to the patterned substrate. Either during casting or with thermal annealing, the masking material 400 selectively dewets from the metal surfaces 20 due to unfavorable physical interactions.

For the fifth method, the masking material is an amorphous polymeric material having any chain architecture (including linear, branched, dendrimeric) and can contain one or more monomeric units. The masking material can be comprised of but not limited to the following systems: poly(vinyl pyridines), poly(vinyl pyrrolidones), poly(vinyl imidazoles) poly(stryenes), poly(esters), poly(methacrylates), poly(acrylates) and poly(glycols), polycarbonates, polyvinylacetates polyalkyls, polyamides, polynitriles, polyureas, polyurethanes, polyethers, polysulfones, polythioethers, polyoxazoles, polyimides, polyheterocyclics, polysilicones, and polysilanes, etc.

Figure 5:
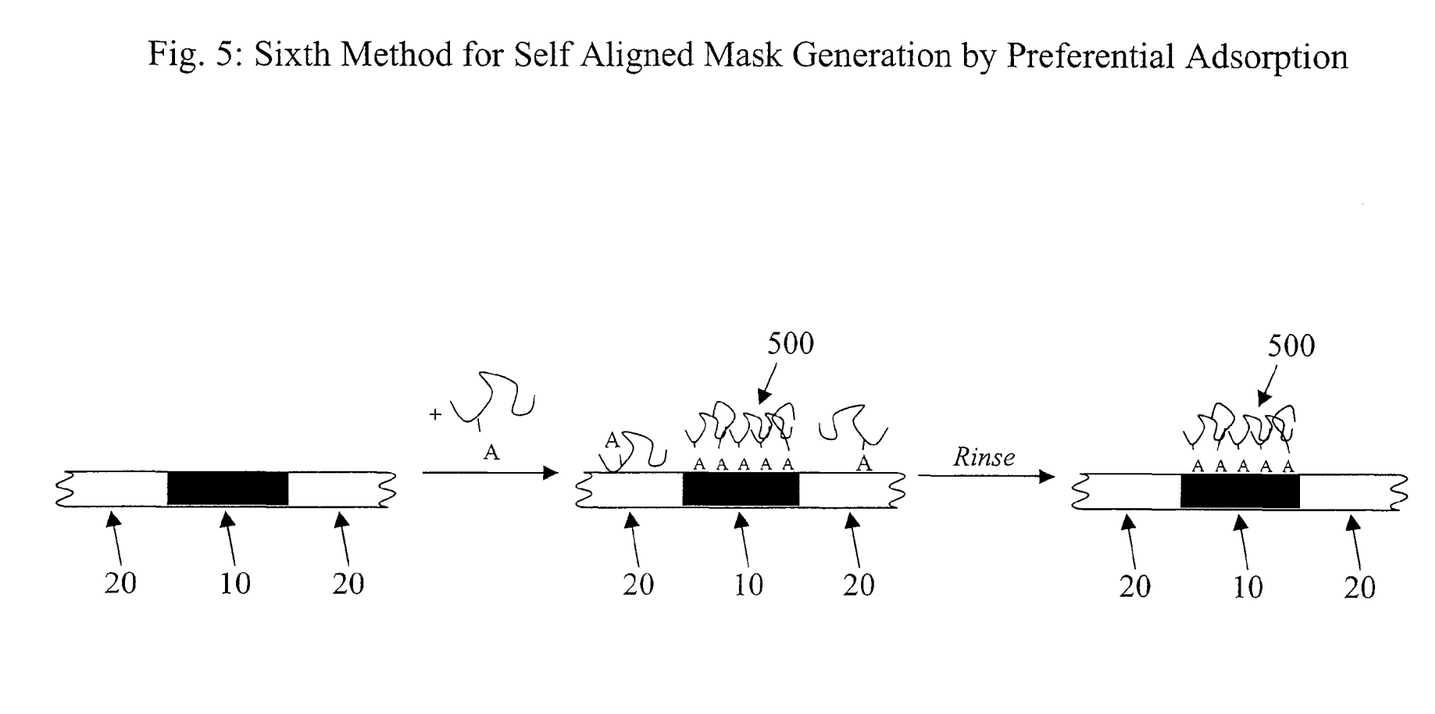
FIG. 5 illustrates a sixth method for generating a self aligned mask in accordance with the invention, by preferential adsorption.

Referring to FIG. 5, a sixth method, in accordance with the invention, for pattern self-replication uses a masking material 500, having one or more functional groups, that selectively adsorbs to the dielectric surface 10. An optional chemical modification of either the dielectric surface 10 or metal surface 20, as described previously, can be first performed. The material is spin coated or applied by any suitable coating method to the pre-patterned substrate. Selective removal of the masking material 500 (for example, by rinsing with a solvent) is then performed to remove the masking material 500 from the metal surface 20 where the physical adsorption does not occur. The displacement of the material in these regions effectively results in a self-aligned mask layer located solely on the dielectric surface 10.

For this sixth method, the masking material is an amorphous polymeric material having any chain architecture (including linear, branched, crosslinked dendrimeric) and can contain one or more monomeric units. The masking material contains one or more functional groups (denoted by A in FIG. 5) that are covalently bound to the polymer. The one or more functional groups can be located in the polymeric material in any arrangement such that the polymer can be considered an end-functionalized polymer, random copolymer, block copolymer, etc. These functional groups can include but are not limited to: hydroxys, esters, ethers, thiols, aldehydes, ketones, carbonates, acids, phenols, amines, amides, imides, thioesters, thioethers, ureas, urethanes, nitriles, isocyanates, thiols, sulfones, halides, phosphines, phosphine oxides, phosphonimides, nitros, azos, Use of the Above Methods in Fabricating IC Chips, Chip Carriers and Circuit Boards Several derived structures can be fabricated using the selective masking methods described above. For purposes of the examples set forth below, the pre-existence of a substrate containing a pattern, the pattern being comprised of a first set of areas of the substrate surface having a first atomic composition including one or more metal elements and having a second set of areas of the substrate surface being a dielectric and having a second atomic composition different from the first composition, is presumed. Selective coverage of the dielectric surface is achieved first by one of the methods described above. The first set of regions which comprises one or metal elements is exposed and is then subjected to processing steps such as electroless deposition alone or electroless deposition of metal, metal or dielectric deposition by sputtering, evaporation, CVD, plasma enhanced CVD and the like, followed by an optional planarization step to form added layers, generally only on the first set of regions.

The resulting structure is a microelectronic interconnect structure comprised of at least one conductive feature with a selective cap on its top surface, formed on a substrate, with the substrate further comprising at least one insulating layer surrounding the conductive feature at its bottom and lateral surfaces and one or more optional conductive barrier layers disposed at one or more of the interfaces between the insulator and the conductive feature.

Figure 6:
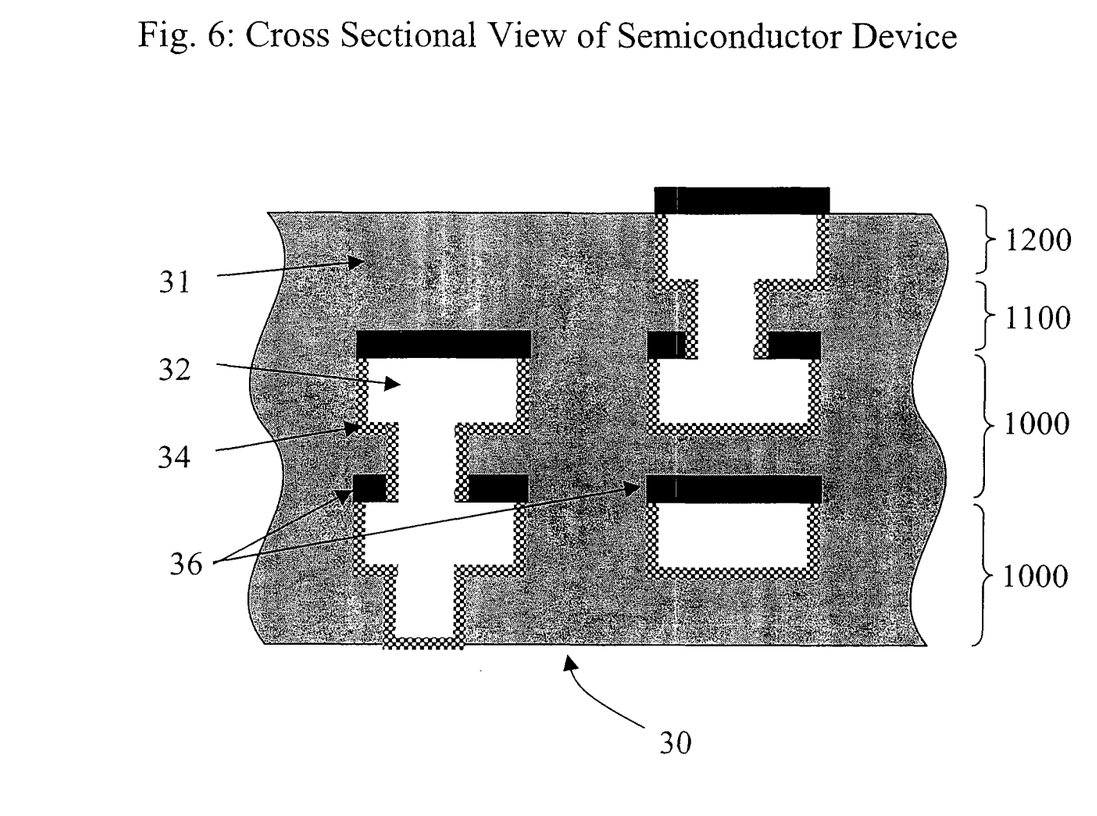
FIG. 6 is a cross sectional view of a semiconductor device in accordance with the invention.

Examples of this structural embodiment include but are not limited to: electrically conductive interconnect wiring which is capped and embedded in a device chip interconnect stack containing insulators, conducting and insulating barrier layers and the like; interconnect wiring of metals disposed on a ceramic chip carrier package; and interconnect wiring disposed on and within an organic chip or device carrier such as a printed circuit board; and thin film wiring arrays on a glass or polymeric substrate used in the fabrication of information displays and related hand held devices Referring to FIG. 6, an interconnect structure 30 having an interlayer dielectric 31, metal wiring 32, liner barrier layer 34, and cap barrier layer 36 is illustrated. The interconnect structure has multiple levels 1000 comprised of via 1100 and line 1200 levels. The preferred materials for the interlayer dielectric 31 have low dielectric constants ($k<3$) and include: carbon-doped silicon dioxide (also known as silicon oxycarbide or SiCOH dielectrics); fluorine-doped silicon oxide (also known as fluorosilicate glass, or FSG); spin-on glasses; silsesquioxanes, including hydrogen silsesquioxane (HSSQ), methyl silsesquioxane (MSSQ) and mixtures or copolymers of HSSQ and MSSQ; and any silicon-containing low-k dielectric. As would be known in the art, this interlayer dielectric may contain pores to further reduce the dielectric constant, and other dielectrics may be used.

Figure 7:
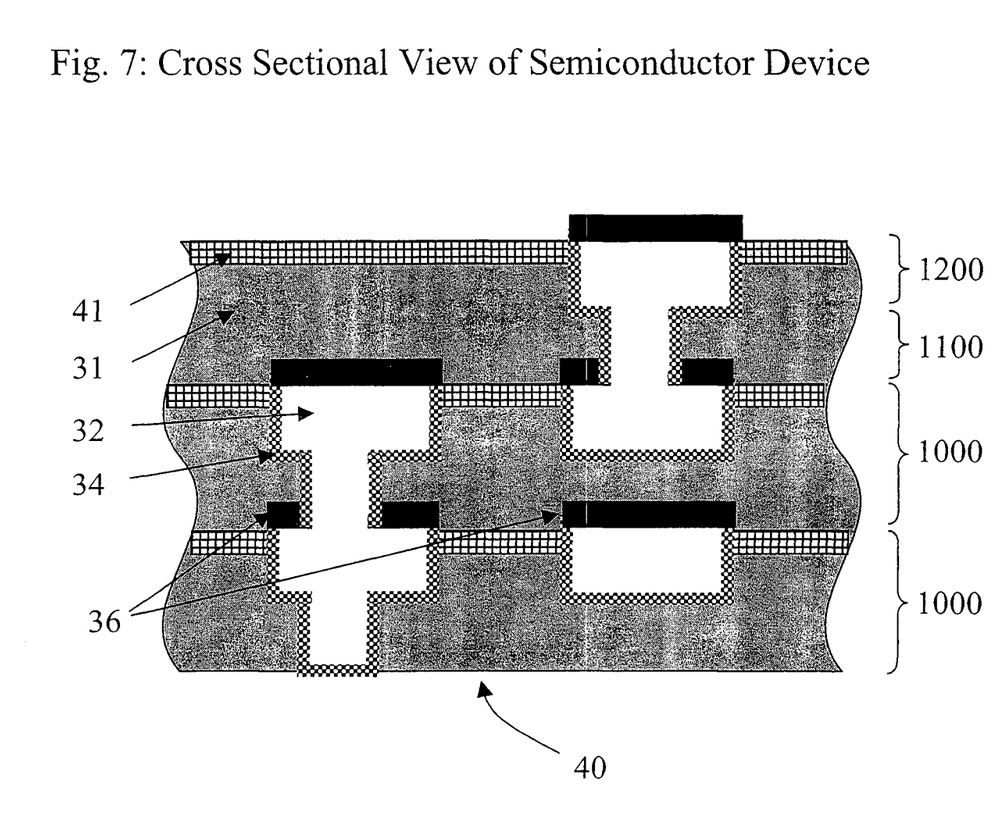
FIG. 7 is a cross sectional view of another semiconductor device in accordance with the invention.

Referring to FIG. 7, an interconnect structure 40 having an interlayer dielectric 31, dielectric hardmask 41, metal wiring 32, liner barrier layer 34, and cap barrier layer 36 is illustrated. The interconnect structure has multiple levels 1000 comprised of via 1100 and line 1200 levels. The preferred materials for the interlayer dielectric 31 have low dielectric constants ($k<3$), may be an organic polymer thermoset, and may be selected from the group SiLK™, (a product of Dow Chemical Co.), Flare™ (a product of Honeywell), and other polyarylene ethers. As would be known in the art, this organic polymer dielectric may contain pores to further reduce the dielectric constant, and other organic polymer thermoset dielectrics may be used. The preferred materials for the dielectric hardmask 41 include: silicon carbides, carbon-doped silicon dioxide (also known as silicon oxycarbide or SiCOH dielectrics); fluorine-doped silicon oxide (also known as fluorosilicate glass, or FSG); spin-on glasses; silsesquioxanes.

Applications of the inventive methods to form selective cap barrier layers 36 on patterned metal interconnects are now described in reference to the structures shown in FIGS. 6 and 7 which may be produced using any of the methods described herein. The structures may be generated through a series of steps known in the art involving photolithography; dielectric deposition by spin coating or chemical vapor deposition; metal deposition by electroplating, electroless plating, thermal evaporation, sputtering; planarization by chemical mechanical polishing; wet and dry etch processes such as reactive ion etching; thermal anneals; wet and dry cleans, etc. The example given includes specific details, but it is evident that numerous alternatives, modifications and variations will be apparent to those skilled in the art in light of the methods descriptions given above. Various materials may form the selective cap (such as silicon nitride, or various refractory metals and compounds of said metals). Further, this invention is not limited to constructions of any particular shape or composition.

The application of the methods described herein would be utilized after chemical mechanical polishing steps that result in a patterned top surface as shown in FIGS. 2-5. A preferred route to produce a self aligned mask may be to apply a polymer mixture of polystyrene (PS) and polymethylmethacrylate (PMMA) onto the patterned substrate by spin coating from a toluene solution and subsequently to remove the polystyrene selectively by dissolution in cyclohexane to expose the metal lines resulting in a structure whereby the remaining polymethylmethacrylate domains generates a topography which is used as the self aligned mask.

In the next step, the PMMA is used as the self aligned mask. A bilayer of tantalum nitride (TaN) and tantalum is then deposited by sputtering in a sputter deposition tool (known in the art) on the patterned substrate containing the self aligned mask. The TaN/Ta bilayer contacts the metal regions and conformally coats the PMMA. The wafer is then placed in a chemical mechanical polishing (CMP) tool and the bilayer is removed from the PMMA, and is left intact on the metal regions. Subsequent, removal of the polymethylmethacrylate by dissolution in toluene produces the cap barrier layer 36 comprised of TaN and Ta only on the metal regions.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications that come within the scope of the appended claims.

What is claimed is:

1. A coated substrate, comprising:
   a substrate,
   wherein the substrate comprises a first set of regions having first chemical characteristics and a second set of regions having second chemical characteristics different from the first chemical characteristics;
   a surface modifying material disposed on the substrate;
   a first polymer on the surface modifying material, and having an affinity for the first set of regions; and
   a second polymer on the surface modifying material, and having an affinity for the second set of regions,
   wherein the first polymer is selected from the group consisting of poly(vinyl imidazoles), polyphosphazenes, polythiophenes, polyimines, polyheterocyclics, polyimides, polyoxazoles, polybenzoxazoles, polythiazoles, polypyazole, polytriazole and polythiophene,
   wherein the second polymer is selected from the group consisting of poly(vinyl pyridines, poly(vinyl imidazoles), poly(glycols), polycarbonates, polyalkyls, polyureas, polyurethanes, polyethers, polysulfones, polythioethers, polyoxazoles, polyimides, polyheterocyclics, polysilicones and polysilanes, and
   wherein the substrate is selected from the group consisting of a silicon wafer, a ceramic chip carrier, an organic chip carrier, a semiconductor wafer, and a circuit board.

2. The coated substrate of claim 1, wherein the first polymer and the second polymer are miscible.

3. The coated substrate of claim 1, wherein the first polymer is poly(vinyl imidazoles).

4. The coated substrate of claim 1, wherein the second polymer is poly(glycols).

5. The coated substrate of claim 1, the surface modifying material is selected from the group consisting of: hexamethyldisilazane, vinyltriacetoxysilane, aminopropyltrimethoxysilane, trimethychlorosilane, and trimethylacetoxysilane.

6. The coated substrate of claim 1, the surface modifying material is selected from the group consisting of: hydroxys, esters, ethers, aldehydes, ketones, carbonates, acids, phenols, amines, amides, imides, thioesters, thioethers, ureas, urethanes, nitriles, isocyanates, thiols, sulfones, halides, phosphines, phosphine oxides, phosphonimides, nitros, azos, thioesters, thioethers, benzotriazoles, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, and indolines.

* * * * *